(12) United States Patent
Cirit et al.

(10) Patent No.: US 9,825,756 B2
(45) Date of Patent: *Nov. 21, 2017

(54) SKEW MANAGEMENT FOR PAM COMMUNICATION SYSTEMS

(71) Applicant: INPHI CORPORATION, Santa Clara, CA (US)

(72) Inventors: Halil Cirit, Santa Clara, CA (US); Karthik Gopalakrishnan, Santa Clara, CA (US); Pulkit Khandelwal, Santa Clara, CA (US); Ravindran Mohanavelu, Santa Clara, CA (US)

(73) Assignee: INPHI CORPORATION, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/375,059

(22) Filed: Dec. 9, 2016

(65) Prior Publication Data

US 2017/0207908 A1 Jul. 20, 2017

Related U.S. Application Data

(63) Continuation of application No. 14/997,961, filed on Jan. 18, 2016, now Pat. No. 9,548,858.

(51) Int. Cl.
*H04L 7/00* (2006.01)
*H04L 7/033* (2006.01)
*H04L 5/00* (2006.01)

(52) U.S. Cl.
CPC .......... *H04L 7/0332* (2013.01); *H04L 5/0048* (2013.01); *H04L 7/033* (2013.01); *H04Q 2213/03* (2013.01)

(58) Field of Classification Search
CPC ...... H04L 7/0332; H04L 5/0048; H04L 7/033
USPC ........................................................ 375/371
See application file for complete search history.

(56) References Cited

U.S. PATENT DOCUMENTS

| 4,805,195 | A | * | 2/1989 | Keegan | ................ H04L 7/0037 327/141 |
|---|---|---|---|---|---|
| 5,467,464 | A | * | 11/1995 | Oprescu | .................... G06F 1/10 713/400 |
| 8,726,064 | B2 | * | 5/2014 | Bennett | ............... G06F 13/1684 710/100 |
| 8,995,600 | B1 | * | 3/2015 | Gopalakrishnan | .... H04L 7/0331 375/376 |
| 2015/0003505 | A1 | * | 1/2015 | Lusted | ................ H04L 25/4917 375/224 |

* cited by examiner

*Primary Examiner* — Helene Tayong
(74) *Attorney, Agent, or Firm* — Richard T. Ogawa; Ogawa P.C.

(57) ABSTRACT

The present invention is directed to communication systems. According to embodiments of the present invention, a communication system includes at least two communication lanes and a skew management module. The skew management module generates a control current based on output test patterns of the two communication lanes. The control current is integrated and compared to a reference voltage by a comparator, which generates an analog offset signal. A PLL of one of the communication lanes generates a corrected clock signal that is adjusted using the analog offset signal to remove or adjust the skew between the communication lanes. The corrected clock signal is used for output data. There are other embodiments as well.

19 Claims, 13 Drawing Sheets

SKEW MANAGEMENT FOR PAM COMMUNICATION SYSTEMS

CROSS-REFERENCES TO RELATED APPLICATIONS

The present application is a continuation of U.S. patent application Ser. No. 14/997,961 filed on Jan. 18, 2016, the entire content of which is incorporated herein by reference.

BACKGROUND OF THE INVENTION

The present invention is directed to communication systems.

Over the last few decades, the use of communication networks exploded. In the early days of the Internet, popular applications were limited to emails, bulletin board, and mostly informational and text-based web page surfing, and the amount of data transferred was usually relatively small. Today, Internet and mobile applications demand a huge amount of bandwidth for transferring photo, video, music, and other multimedia files. For example, a social network like Facebook processes more than 500 TB of data daily. With such high demands on data and data transfer, existing data communication systems need to be improved to address these needs. For high-speed data communication applications, pulse-amplitude modulation (PAM) technique is often used. Among other things, PAM ($2^n$, with n>1) provides an improved spectral efficiency that allows for higher data throughput on communication media.

Over the past, there have been many types of communication systems and methods. Unfortunately, they have been inadequate for various applications. Therefore, improved systems and methods are desired.

BRIEF SUMMARY OF THE INVENTION

The present invention is directed to communication systems. According to embodiments of the present invention, a communication system includes at least two communication lanes and a skew management module. The skew management module generates a control current based on output test patterns of the two communication lanes. The control current is integrated and compared to a reference voltage by a comparator, which generates an analog offset signal. A PLL of one of the communication lanes generates a corrected clock signal that is adjusted using the analog offset signal to remove or adjust the skew between the communication lanes. The corrected clock signal is used for output data. There are other embodiments as well.

According to an embodiment, the present invention provides a communication system. The system includes a first communication lane that has a first PLL and a first pattern generator. The first communication lane is configured to output a first data segment. The first pattern generator is configured to generate a first predetermined pattern. The first PLL is configured to generate a first clock signal. The system also includes a second communication lane that has a second PLL and a second pattern generator. The second PLL is configured to provide a second clock signal. The second PLL includes a sigma-delta modulator (SDM). The second communication lane is configured to output a second data segment. The second pattern generator is configured to generate a second predetermined pattern. The SDM is configured to generate a skew offset using an analog offset signal for the second clock signal. The system further includes a PAM module that is configured to align the first data segment and the second data segment and output a PAM signal. The system additionally includes a skew management module that is configured to generate the analog offset signal. The skew management module has a phase frequency detector (PFD) and a charge pump and a comparator. The PFD is configured to generate a control current by comparing the first predetermined pattern and the second predetermined pattern. The charge pump is configured to store the control current and characterized by a control voltage. The comparator is configured to generate the analog offset signal by comparing the control voltage to a predetermined reference voltage.

According to another embodiment, the present invention provides a communication system that includes a first communication lane that has a first PLL and a first pattern generator. The first communication lane is configured to output a first data segment. The first pattern generator is configured to generate a first predetermined pattern. The first PLL is configured to generate a first clock signal. The system also includes a second communication lane comprising a second PLL and a second pattern generator. The second PLL is configured to provide a second clock signal. The second PLL has a first sigma-delta modulator (SDM). The second communication lane is configured to output a second data segment, the second pattern generator being configured to generate a second predetermined pattern. The first SDM is configured to generate a first skew offset using a first analog offset signal for the second clock signal. The system further includes a third communication lane comprising a third PLL and a third pattern generator. The third communication lane is configured to output a third data segment. The third pattern generator is configured to generate third predetermined pattern. The third PLL comprises a second SDM that is configured to generate a second skew offset using a second analog offset signal for the third clock signal. The system additionally includes a PAM module that is configured to align the first data segment and the second data segment and the third data segment and output a PAM signal. The system further includes a first skew management module that is configured to generate the first analog offset signal. The skew management module has a phase frequency detector (PFD) and a charge pump and a comparator. The PFD is configured to generate a control current by comparing the first predetermined pattern and the second predetermined pattern. The charge pump is configured to store the control current and characterized by a control voltage. The comparator is configured to generate the analog offset signal by comparing the control voltage to a predetermined reference voltage. The system further includes a second skew management module that is configured to generate the second analog offset signal based at least on the second predetermined pattern and the third predetermined pattern.

According to yet another embodiment, the present invention provides a skew management device that includes a first input selector module that is configured to output a reference signal based on a first selected signal of two input signals. Each of the two input signals has a predetermined pattern. The device also includes a second selector module that is configured to output a feedback signal based on a second selected signal of the two input signals. The device further includes a phase frequency detector that is configured to generate a control current based on the reference signal and the feedback signal. The device additionally includes an integrator module that configured to store the control current over a predetermined period of time and characterized by a control voltage. The device further includes a comparator module that is configured to generate an analog offset signal based on the control voltage and a reference voltage. The device additionally includes a reset module for discharging the integrator module.

It is to be appreciated that embodiments of the present invention provide many advantages over existing techniques. Among other features, skew between two or more communication lanes can be determined and optimized for high speed communication. For example, once relative skew between two or more communication lanes is determined, the skew between two communication lanes can be remove or adjusted. It is advantageous, as provided according to embodiments of the present invention, to perform skew removal at the transmitter end, as skew removal is difficult (if not impossible) and expensive to perform at the receiver end. For communication systems that need to align data from more than two communication lanes, skew management modules according to embodiments of the present invention can be cascaded among the communication lanes. It is to be appreciated that skew management modules and techniques thereof can be implemented in conjunction with existing systems and manufacturing processes. There are other benefits as well.

The present invention achieves these benefits and others in the context of known technology. However, a further understanding of the nature and advantages of the present invention may be realized by reference to the latter portions of the specification and attached drawings.

DETAILED DESCRIPTION OF THE INVENTION

Figure 1:
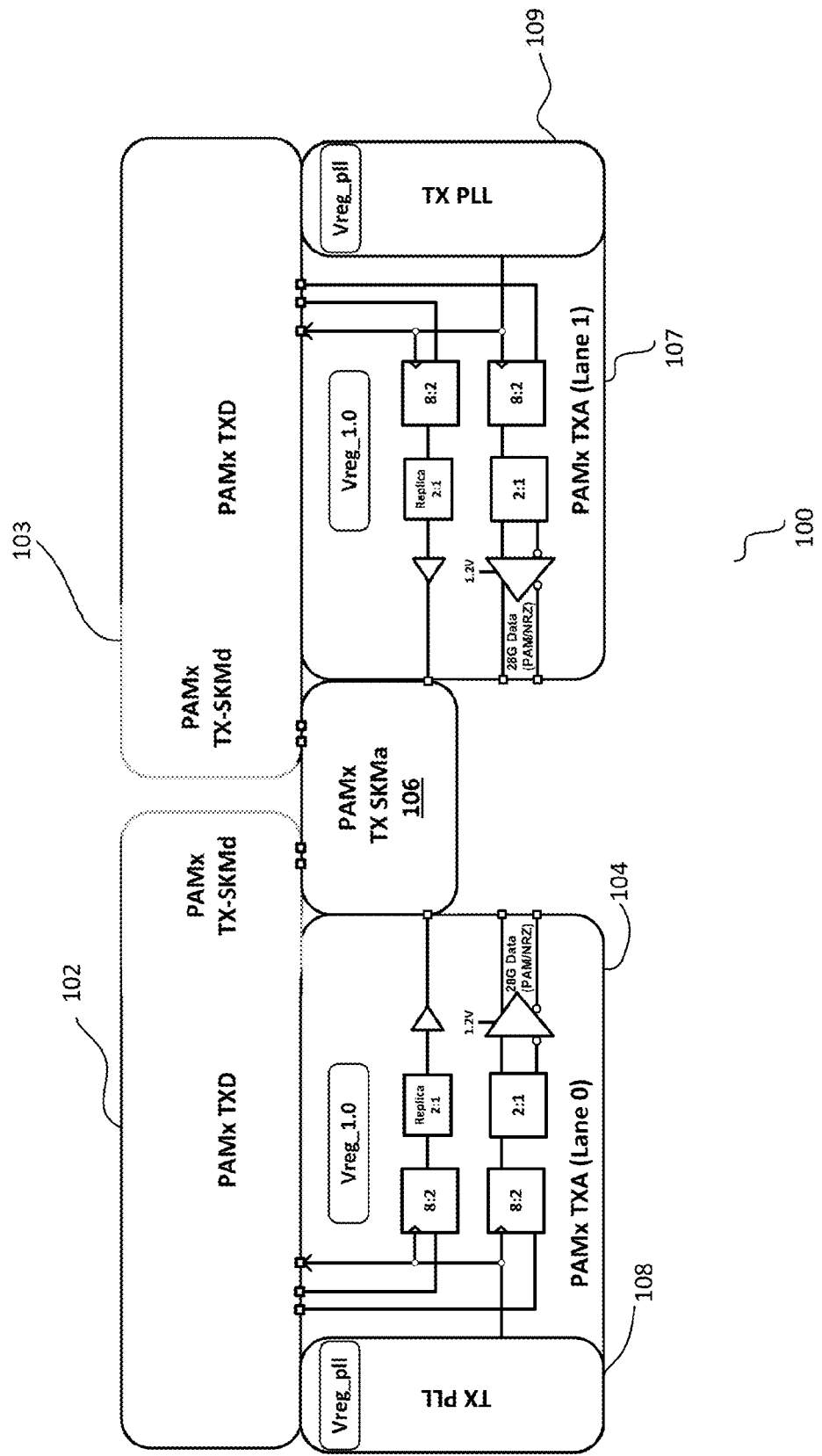
FIG. 1 is a simplified diagram illustrating a PAM communication system 100 according to an embodiment of the present invention.

The present invention is directed to communication systems. According to embodiments of the present invention, a communication system includes at least two communication lanes and a skew management module. The skew management module generates a control current based on output test patterns of the two communication lanes. The control current is integrated and compared to a reference voltage by a comparator, which generates an analog offset signal. A PLL of one of the communication lanes generates a corrected clock signal that is adjusted using the analog offset signal to remove or adjust the skew between the communication lanes. The corrected clock signal is used for output data. There are other embodiments as well.

As mentioned above, a high-speed communication system often involves using two more communication lanes. For example, a PAM4 signal can be created by summing most significant bits from one lane and least significant bits from another lane. Similarly, a PAMn signal can be created by aligning and summing data from n communication lanes. To sum data from multiple communication lanes efficiently and accurately, it is important to properly align the data. To align data from different communication lanes, relative skew among the data clock needs to be determined and addressed. For example, "skew" refers to clock or data signal arriving from different communication lanes at different times. Over the past, there have been various techniques for managing skew. Unfortunately, conventional techniques have been inadequate.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

FIG. 1 is a simplified diagram illustrating a PAM communication system 100 according to an embodiment of the present invention. This diagram is merely an example, which should not unduly limit the scope of the claims. One of ordinary skill in the art would recognize many variations, alternatives, and modifications. As shown in FIG. 1, data are transmitted between communication module 104 and communication module 107. More specifically, communication module 104 works in conjunction with module 102 and PLL 108; communication module 107 works in conjunction with module 103 and PLL 109. When communication module 104 transmits data to communication module 107 (or vice versa), a skew management module 106 is also used to facilitate data alignment. For example, two 8-bits data lanes are combined to provide a 16-bits data lane, and module 106 facilitates the alignment of two lanes.

The TXD modules 102 and 103 provide digital functions. In a specific embodiment, each of the TXD modules is used for receiving a 2 sets of 40 bit data word (MSB and LSB) and serializing it to 2 sets of 8 bits, as required for NRZ or PAM4 modes. Additionally, TXD modules generate the word clock output to the core logic. The TXD modules 102 and 103 are also responsible for the managing the skew on the high-speed data transmission across dual-NRZ streams, in conjunction with the skew management module 106. For example, the PAM communication system includes a Management Data Input/Output (MDIO) for providing serial data communication, which includes management data I/O, data communication, and device configuration. In certain implementations, the MDIO module is configured inside the TXD module. In various implementations, the TXD modules 102 and 103 also implement all the MDIO registers for the TX as well as providing overrides for all the voltage regulators and TX PLL configuration and status.

The TXA modules 104 and 107 are configured to provide mixed digital and analog functions, which include serializing MSB and LSB parallel 8-bits wide words into a serial bit stream. For example, when serializing MSB and LSB words, skew management module 106 helps aligning the MSB and LSB words, and details of which are provided below. In certain implementations, TXA modules 104 and 107 are configured to drive a 100 Ω differential load in PAM4 mode, and they are adapted to apply the pre and post cursor data. When operating in NRZ mode, the TXA modules provide similar functions on the MSB stream, and the LSB stream is used to carry data (clock-patterns) for skew management (if enabled).

The PLL modules 108 and 109 provide clock signals. For example, the PLL modules use a clock recovered from the receiver as a reference to generate the high-speed (e.g., 14 G or even higher) 2-UI clocks needed for the TXA modules. It is understood that data rates shown in various diagrams merely provide examples, and different data rates are possible as well. In various implementations, the reference clock for the TX PLL modules 108 and 109 is primarily the recovered clock from the partnered transceiver. This keeps the transmission frequency locked to the frequency of incoming data, which may be asynchronous to local reference frequency. For example, PLL module 108 and 109 generate two phases of 2UI clock for the TXA modules, where each phase is offset by 1UI. The TXA module output divided 8UI clock to the TXD modules, which in turn generate a 40UI clock output to the core used to generate new "data_in" data for transmission. TXD modules 102 and 103 provide the first stage of interleave and generate 8-bits wide data to the TXA modules, where the final 8:1 interleave is performed before transmission. TXA modules 104 and 107 also provide a finite impulse response (FIR) function for line equalization, with pre and post cursor compensation levels set from registers contained in TXD modules. In certain implementations, TXD modules comprise fuse-able registers for providing trimming of the voltage regulators, phase tuning of the clocking and output impedance of the TXA.

As shown in FIG. 1, the physical placement of the TXD logic (e.g., TXD modules 102 and 103) in the transmitter means that the signals between the TXD and the core logic need to be re-buffered through a "routing channel" to maintain acceptable slew rates over the routing distance. This is also true of signals running between the TXD modules 102 and 103 and the TX PLL module 108 and 109. According to an exemplary implementation, signals between TXD modules and TXA modules have critical 3.5 GHz timing and the placement is such that these can be routed directly. For example, logic of the TXD modules 102 and 103 can be used in multiple transmitter topologies for different implementations, and the routing channels can be created in separate levels of hierarchy to allow different routing to be accommodated while keeping the substantially the same TXD layout as shown in FIG. 1. In a specific embodiment, a "tx_routing" cell is used to contain buffers and signal routing between the TXD modules and the core logic. A "tx_pll_routing" cell is provided to contain the buffering between the TXD modules and the TX PLL modules. A "tx_txd_pnr" cell is used at the transmission level as a wrapper round the "tx_txd" digital logic and the two routing channels.

Figure 2:
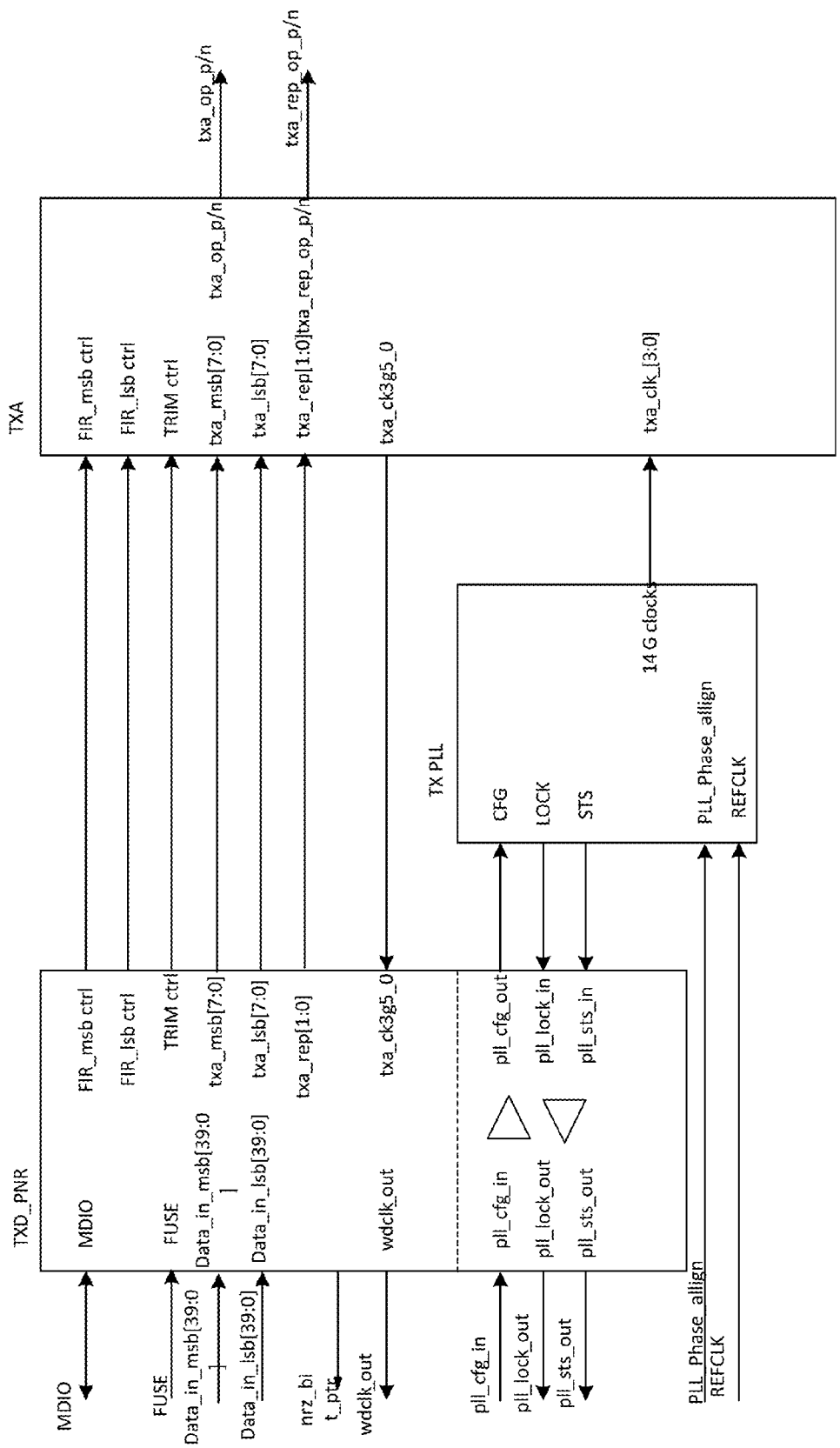
FIG. 2 is a simplified diagram illustrating a transmitter according to an embodiment of the present invention.

FIG. 2 is a simplified diagram illustrating a transmitter according to an embodiment of the present invention. This diagram is merely an example, which should not unduly limit the scope of the claims. One of ordinary skill in the art would recognize many variations, alternatives, and modifications. As can be seen in FIG. 2, the TXD module provides digital control signals for the TXA module, and clock signal is provided by the TX PLL module.

A primary function of the TXD is to capture 2 pairs of 40-bit wide data from the core logic, MSB (e.g., Data_in_msb[39:0]) and LSB (e.g., Data_in_lsb[39:0]), and multiplex this down to 2 pairs of 8-bit wide data for final transmission by the TXA circuit in PAM4 mode. A "word clock" ("wdclk_out") signal is generated to provide new data from the core by dividing the high speed txa_ck3g5_0 clock from the TXA. In a specific embodiment, different dividing ratios are used at different transmit line rates to maintain the wdclk_out work clock at approximately 700 MHz. In addition to the mission mode divider, a clock control module is used to generate a fixed number of clock pulses in ATPG mode to support at-speed transition fault testing.

During a PAM4 transmission mode, the TXD module generates 2 separate 8-bits data patterns, "txa_msbdata" and "txa_lsbdata". During an NRZ mode TXD, if the skew management is disabled, the MSB data path is used to multiplex the pattern from the core "msbdata_in [39:0]"

down to the 8-bit output on "txa_msbdata" and the LSB data path is powered down. If, however, the skew management function is enabled, the LSB data path carries data from the skew management pattern generator.

As seen in FIG. 2, the TXD module contains a block of MDIO addressable registers for configuration and control of both the TXD and TXA modules. In certain embodiments, many aspects of the TXA module are fuse trimmed, and each trim value is also override-able with an MDIO register. In various implementations, the PLL module generates the high speed TXA clocks (e.g., 14 GHz clock). As shown, configuration and status buses for TX PLL module are routed through TXD to provide buffering and isolation from the core logic and enable the loading to be checked.

Figure 3:
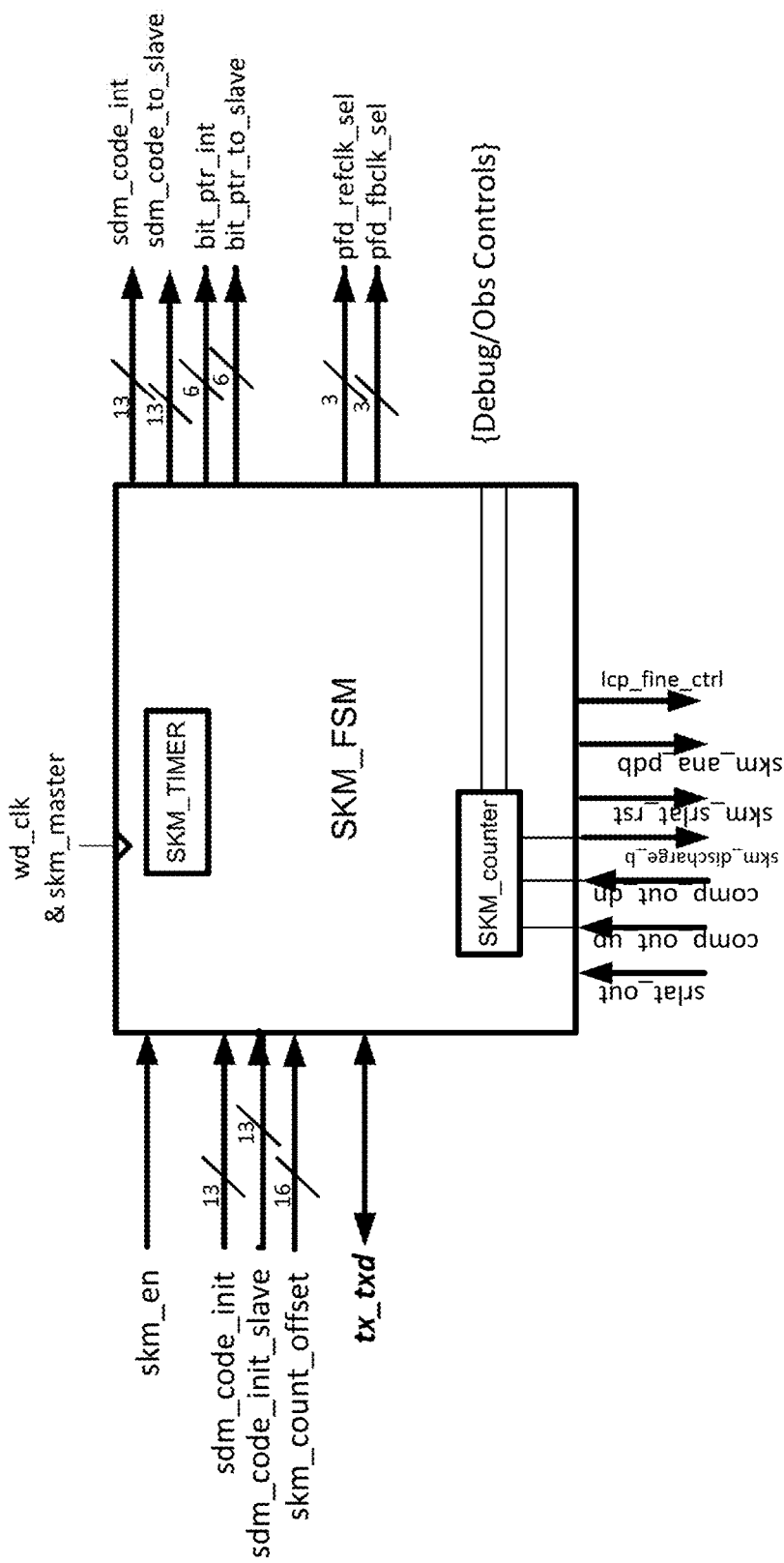
FIG. 3 is a simplified diagram illustrating a skew management module according to an embodiment of the present invention.

FIG. 3 is a simplified diagram illustrating a skew management module according to an embodiment of the present invention. This diagram is merely an example, which should not unduly limit the scope of the claims. One of ordinary skill in the art would recognize many variations, alternatives, and modifications. In various embodiments, the skew management module operates in NRZ and PAM modes. When operating in NRZ mode, the transmission system aligns outputs of the transmit lanes corresponding to MSB and LSB data streams to within a predetermined interval (e.g., 1 μs) of each other. Based on transmission architecture as (e.g., as shown in FIG. 1), there may be an "x.y" UI skew between the two lanes, where x is the integer portion arising from divider uncertainties and y is fractional portion arising from propagation delay mismatches in the clock paths. The function of the skew management finite state machine (FSM) is to align the two lanes.

In various implementations, the "SKM_FSM" block as shown in FIG. 3 is the main control block for the skew management circuitry. For example, the digital components of the SKM_FSM is implemented as a part of the TXD module and the analog component implemented in the "tx_skma" module, as shown in FIG. 1. To manage skew, the skew management module generates a clock pattern that can be muxed on to the redundant lsb_data stream (in NRZ mode) within the TXD module. An "ictrl" current output is integrated on a capacitor and when the voltage node on the capacitor reaches a predetermined reference voltage +/−Vref (reference voltage from a DAC), the comparator produces an appropriate output on comp_out_hi/lo, which indicates phase error. More specifically, the slew-rate on the capacitor voltage is inversely proportional to the phase error between the master/slave and reference clock. For example, SKM_FSM block uses an internal timer to measure the phase error. The timer counts are fed into an arithmetic logic to determine increment or decrement offset "bit_ptr" during coarse align and the sigma-delta modulator (SDM) code during fine align. The SDM output drives and/or modulates the an offset signal "icp_offset" control to the local PLL charge pump to introduce a deliberate offset between the PLL's reference clock and feedback clock, thereby moving the phase of the voltage control oscillator (VCO) output clock signal "clk". Since the clock signal is used during the data transmission and alignment process, the skew is management and/or eliminated by changing the clock signal as described above.

Figure 4:
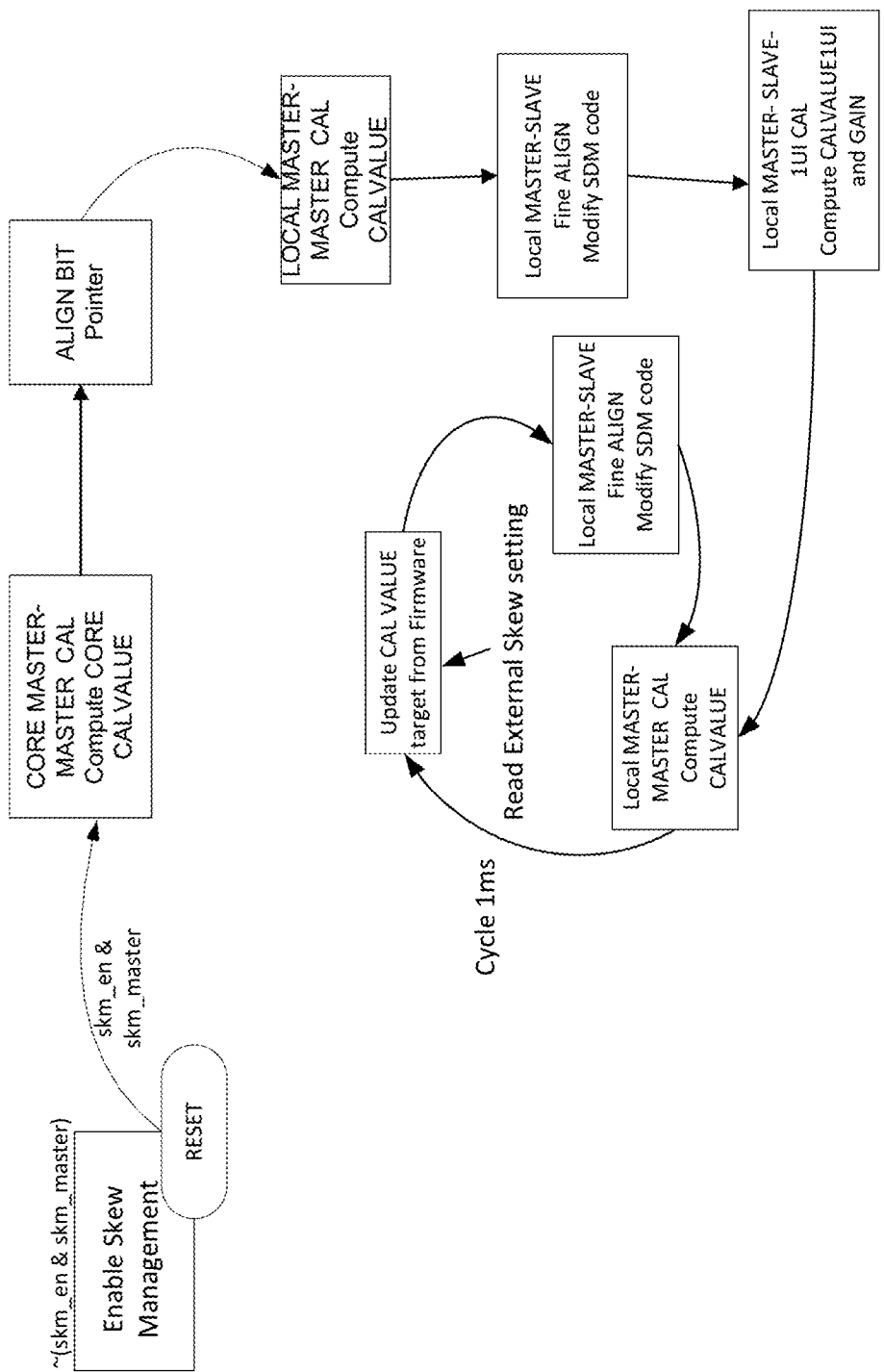
FIG. 4 is a simplified flow diagram illustrating operation of an exemplary SKM_FSM module according to an embodiment of the present invention.

FIG. 4 is a simplified flow diagram illustrating operation of an exemplary SKM_FSM module according to an embodiment of the present invention. This diagram is merely an example, which should not unduly limit the scope of the claims. One of ordinary skill in the art would recognize many variations, alternatives, and modifications. For example, one or more steps may be added, removed, repeated, rearranged, modified, replaced, and/or overlapped, which should not limit the scope of the claims. For example, a skew management process is performed as needed.

Figure 5:
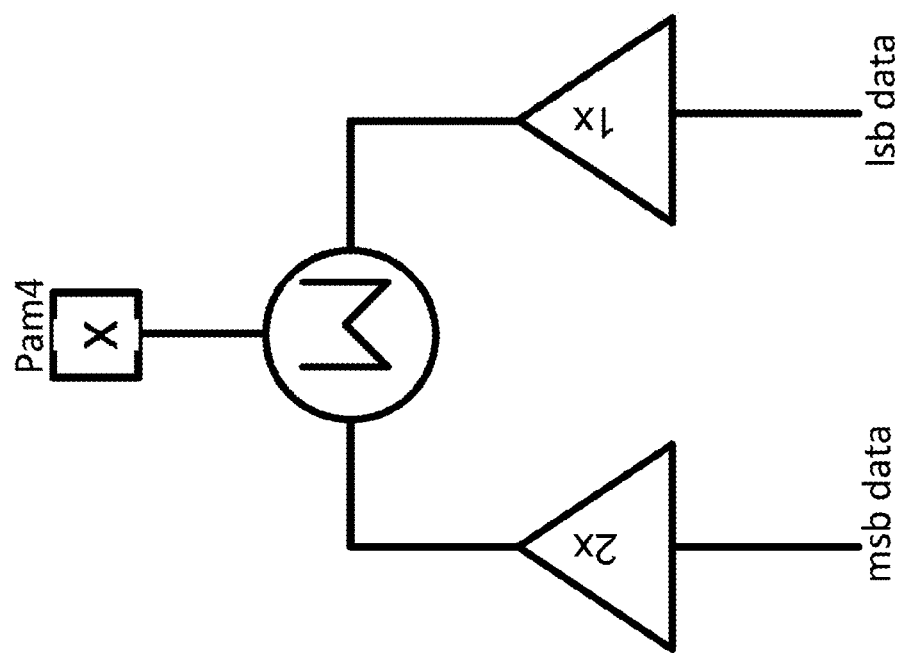
FIG. 5 is a simplified diagram illustrating a PAM4 configuration according to an embodiment of the present invention.

It is to be appreciated that skew management is an important aspect of data communication, where two or more communication lanes are used. For example, when the system 100 operates in an internal PAM4 mode, an PAM4 signal is created by summing MSB and LSB data with a 2 to 1 weight as respected. FIG. 5 is a simplified diagram illustrating a PAM4 configuration according to an embodiment of the present invention. This diagram is merely an example, which should not unduly limit the scope of the claims. One of ordinary skill in the art would recognize many variations, alternatives, and modifications. As can be seen in FIG. 5, MSB data and LSB data are combined to form PAM4 signal. Similarly, when operating in an external PAM4 mode, an PAM4 eye is created by summing 2 different transmitter outputs on the laser driver.

Figure 6:
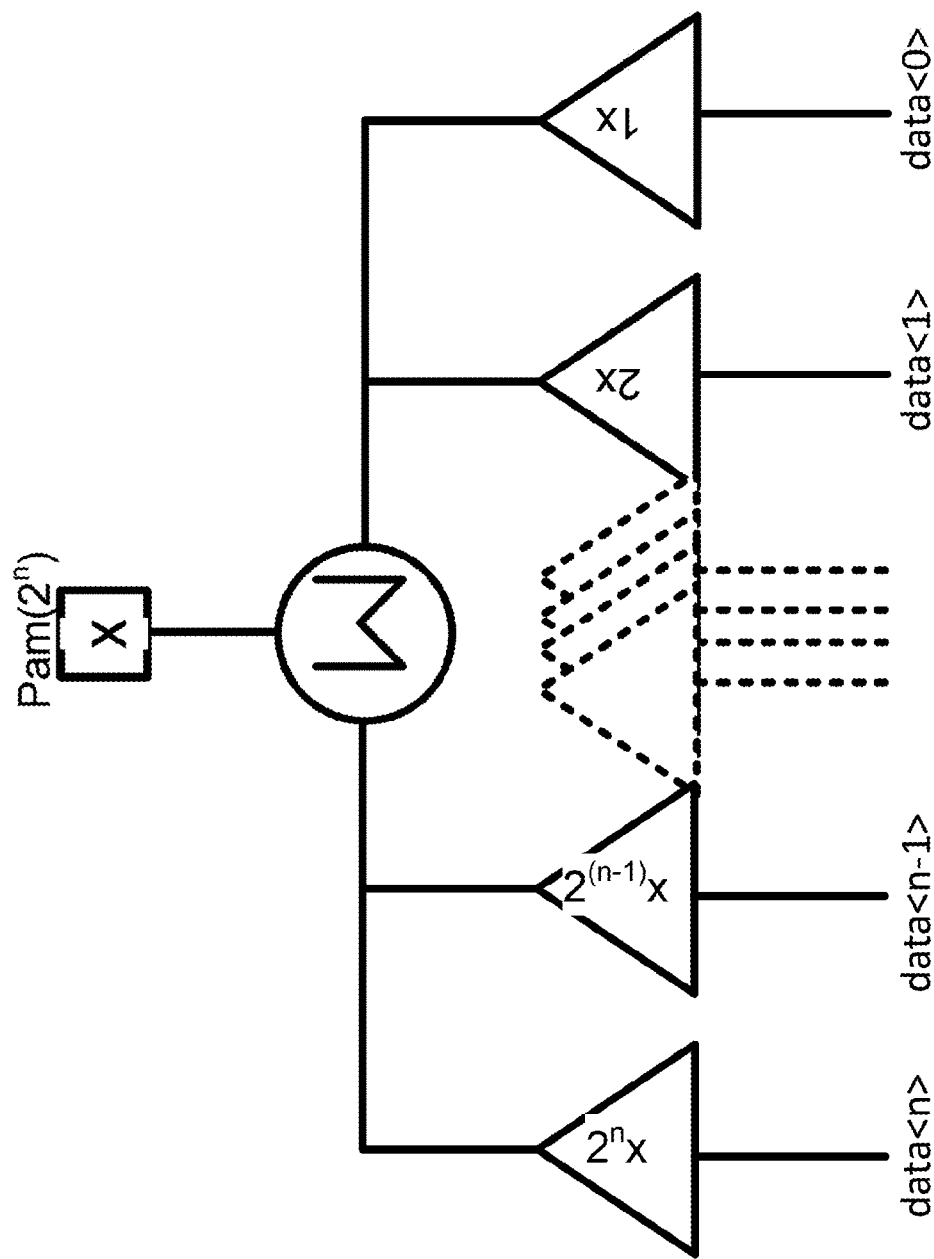
FIG. 6 is a simplified diagram illustrating a PAM($2^n$) configuration according to an embodiment of the present invention.
Figure 7:
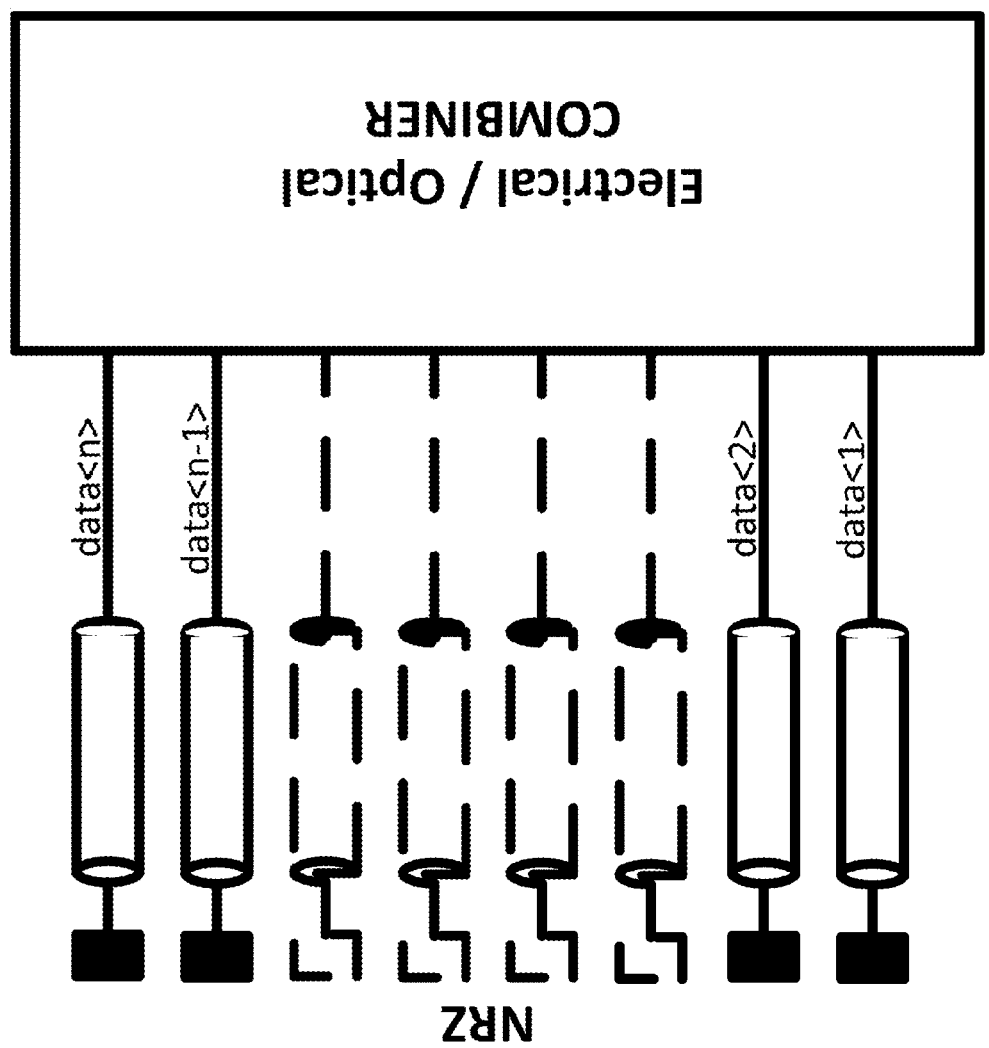
FIG. 7 is a simplified diagram illustrating a communication configuration where n NRZ communication lanes are combined by electrical/optical combiner according to embodiments of the present invention.

Depending on the application, a PAM($2^n$) configuration can be arranged as well. FIG. 6 is a simplified diagram illustrating a PAM($2^n$) configuration according to an embodiment of the present invention. This diagram is merely an example, which should not unduly limit the scope of the claims. One of ordinary skill in the art would recognize many variations, alternatives, and modifications. For example, a large number of communication lanes can be combined together to provide PAM($2^n$) modulation. FIG. 7 is a simplified diagram illustrating a communication configuration where n NRZ communication lanes are combined by electrical/optical combiner according to embodiments of the present invention. This diagram is merely an example, which should not unduly limit the scope of the claims. One of ordinary skill in the art would recognize many variations, alternatives, and modifications. Regardless of the number of lanes, aligning data from different data communication lanes is needed. For example, as data from separate transmission lanes (e.g., NRZ lanes) are summed, data need to be aligned. A delay between these data is often shown as an undesirable eye closure, which is critical and almost impossible to correct at the receiver end, and thus need to be corrected at the transmitter side. It is thus to be appreciated that by providing skew removal at the transmitter end according to embodiments of the present invention, throughput and accuracies of data transfer are improved. In addition, when there are two or more communication lanes, one of the communication lane is skewed in relation to the other(s) to compensate the external delays, which can be attributed to circuit packaging or other factors.

As an example, delay mismatch or skew among communication lanes can be attribute to silicon mismatch. More specifically, un-synchronized divider(s) might start on different states, which leads up to large logical delay between different lanes. Also, synchronizing a universal reset is typically costly both for power and timing closure. The monte-carlo mismatch on the high speed clock and data path often contributes to intra-UI skew as well.

Circuit packaging or circuit boards on which the communication systems are implemented may have mismatch problems. For example, even when the data lanes are perfectly matched, physic mismatch of circuit packaging or circuit board still causes data skew. Furthermore, optical delays also contribute to skew of data lanes. Often, segmented modulators impose certain skew requirements on the electrical inputs to generate the optical PAM signal.

Figure 8:
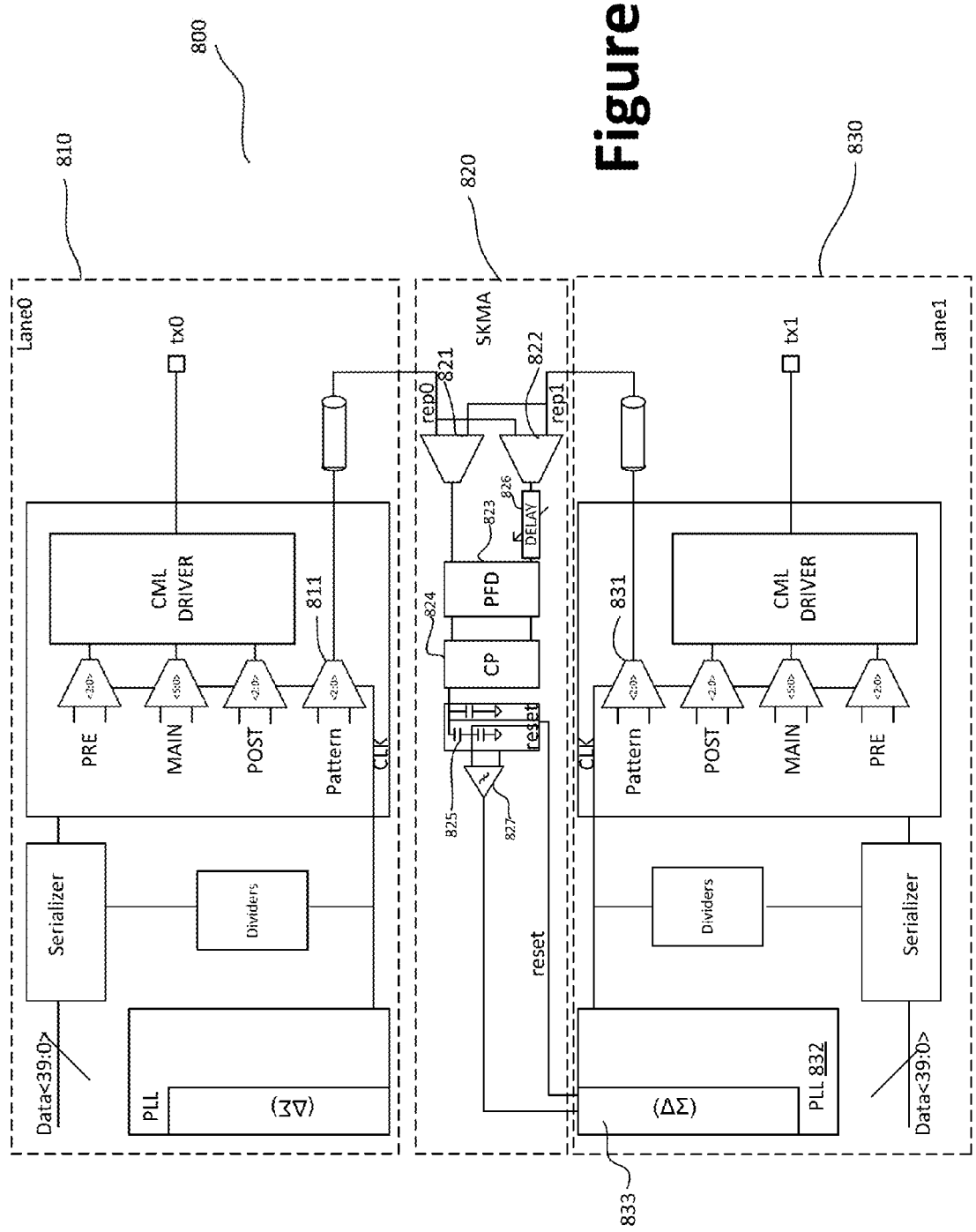
FIG. 8 is a simplified diagram illustrating a PAM communication system 800 according to an embodiment of the present invention.

FIG. 8 is a simplified diagram illustrating a PAM communication system 800 according to an embodiment of the present invention. This diagram is merely an example, which should not unduly limit the scope of the claims. One of ordinary skill in the art would recognize many variations, alternatives, and modifications. Communication system 800, as way of an example, provides PAM4 communication by using data transmission through two communication lanes. Section 810 provides configuration for "Lane 0", which is a 40-bits (data <39:0>) wide data lane that provides LSBs. Section 830 provides configuration for "Lane 1", which is a 40-bits (data <39:0>) wide data lane that provides MSBs. The skew management module 820 provides alignment between Lane 0 and Lane 1.

In FIG. 8, each of the lane sections comprises a PLL that provides clock signal for regulating the data frequency, and the output is provided by the current mode logic (CML) driver. By changing clock signals generated by the PLL, data from Lane 0 and Lane 1 can be aligned. For example, by detecting the skew between Lane 0 and Lane 1, a skew offset is determined and used to remove the skew between Lane 0 and Lane 1.

During an offset calibration process, the pattern generators 811 and 831, respectively for Lane 0 and Lane 1, provide a predetermined pattern to the SKMA module 820. For example, the predetermined pattern is a clock pattern that is specifically selected for determining skew offset. Patterns from Lane 0 and Lane 1 processed and selected by the MUX 821 and MUX 822. The output of the MUX 822 is connected to a delay module 826, which is in turn connected to the phase frequency detector (PFD) 823. The output of the MUX 821 as shown is also connected to the PFD 823, without going through the delay module 836. It is to be appreciated that since both Lane 0 and Lane 1 are coupled to both MUX 821 and MUX 822, the MUX modules can determine which of the communication lanes to be delayed before connecting to the PFD 823. As an example, the output of the PFD 823 is "ictrl" control current output that is integrated by the charge pump 824. For example, charge pump 824 comprises one or more capacitors to store charge from the "ictrl" current. When the charge on stored at the charge pump 824 reaches a predetermined reference voltage, the comparator 827 outputs a phase error signal. For example, the reference voltage "Vref", which may be positive or negative, is provided by a DAC module, which receives the reference voltage value from a control module. The phase error signal is provided to the PLL 832 to compensate its clock signal output. For example, the PLL 832 includes a sigma-delta modulator (SDM) 833 for converting the analog signal from the comparator 827 to a digital value that is then used by the PLL 832. In various embodiments, the slew rate on the charge pump 824 is inversely proportional to the phase error. In a specific embodiment, an internal timer is to measure the phase error. The timer counts are fed into an arithmetic logic to determine increment or decrement offset "bit_ptr" during coarse align and the SDM code during fine align.

Figure 9:
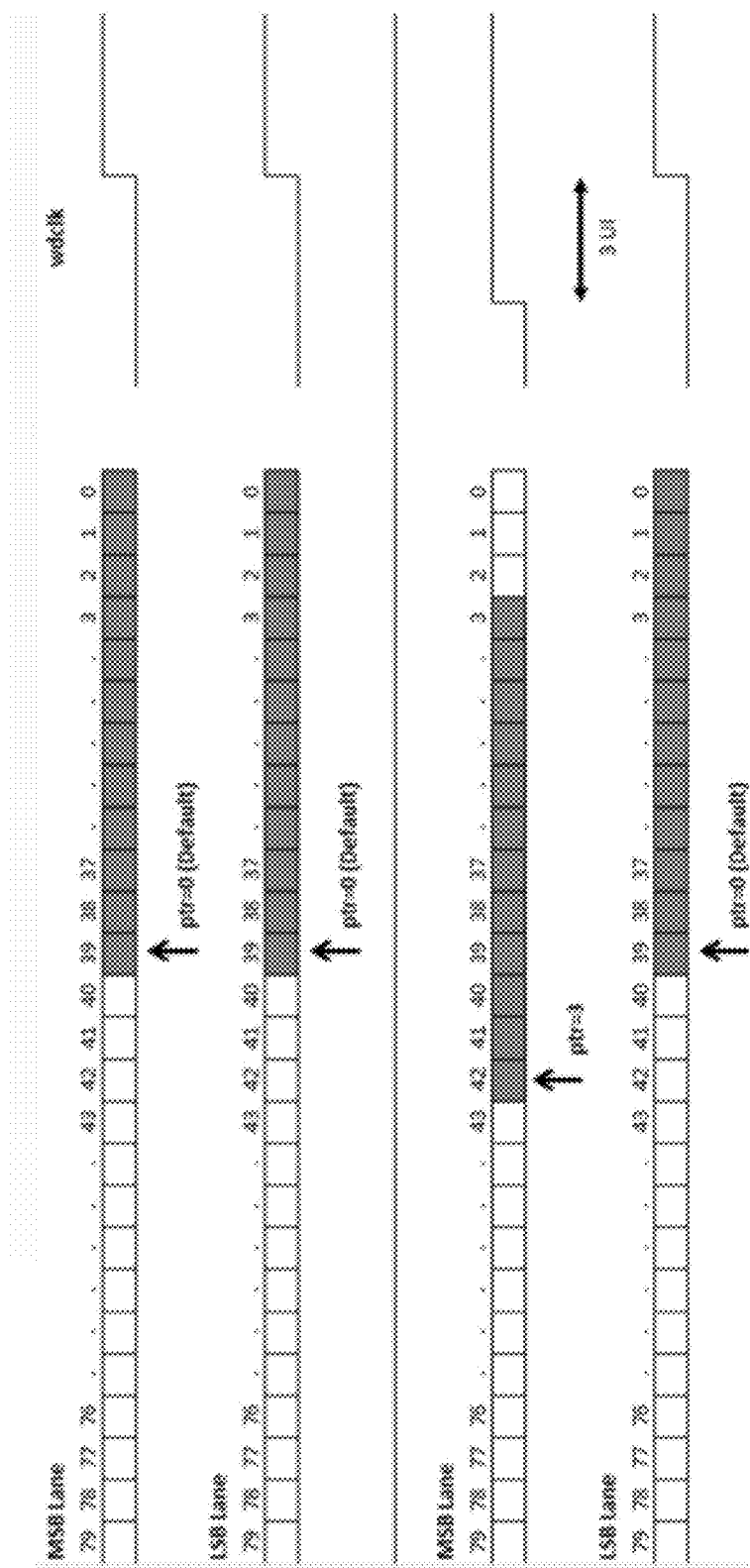
FIG. 9 is a simplified diagram illustrating a processing for aligning MSB and LSB data lanes according to an embodiment of the present invention.

FIG. 9 is a simplified diagram illustrating a processing for aligning MSB and LSB data lanes according to an embodiment of the present invention. This diagram is merely an example, which should not unduly limit the scope of the claims. One of ordinary skill in the art would recognize many variations, alternatives, and modifications. At the default setting, MSB data lane and the LSB data lane are at bit 39, as indicated by their respective pointers. However, once the skew offset between the two data lanes is determined (e.g., 3 unit intervals, or 3 UI), the MSB pointer is at bit 42, and LSB pointer is at bit 39. By changing relative pointer positions, the two data lanes are aligned.

The SDM 833 output drives and/or modulates the an offset signal "icp_offset" control to the PLL 832 to introduce a deliberate offset between the PLL's reference clock and feedback clock, thereby moving the phase of the voltage control oscillator (VCO) of the PLL output clock signal "CLK". Since the clock signal is used during the data transmission and alignment process, the skew is management and/or eliminated by changing the clock signal as described above. The charge pump 824 is connected a reset switch 825. For example, once offset is determined, a loop filter at the reset switch 825 is reset. In certain embodiment, the reset switch also resets the PFD 823 as needed.

Figure 10:
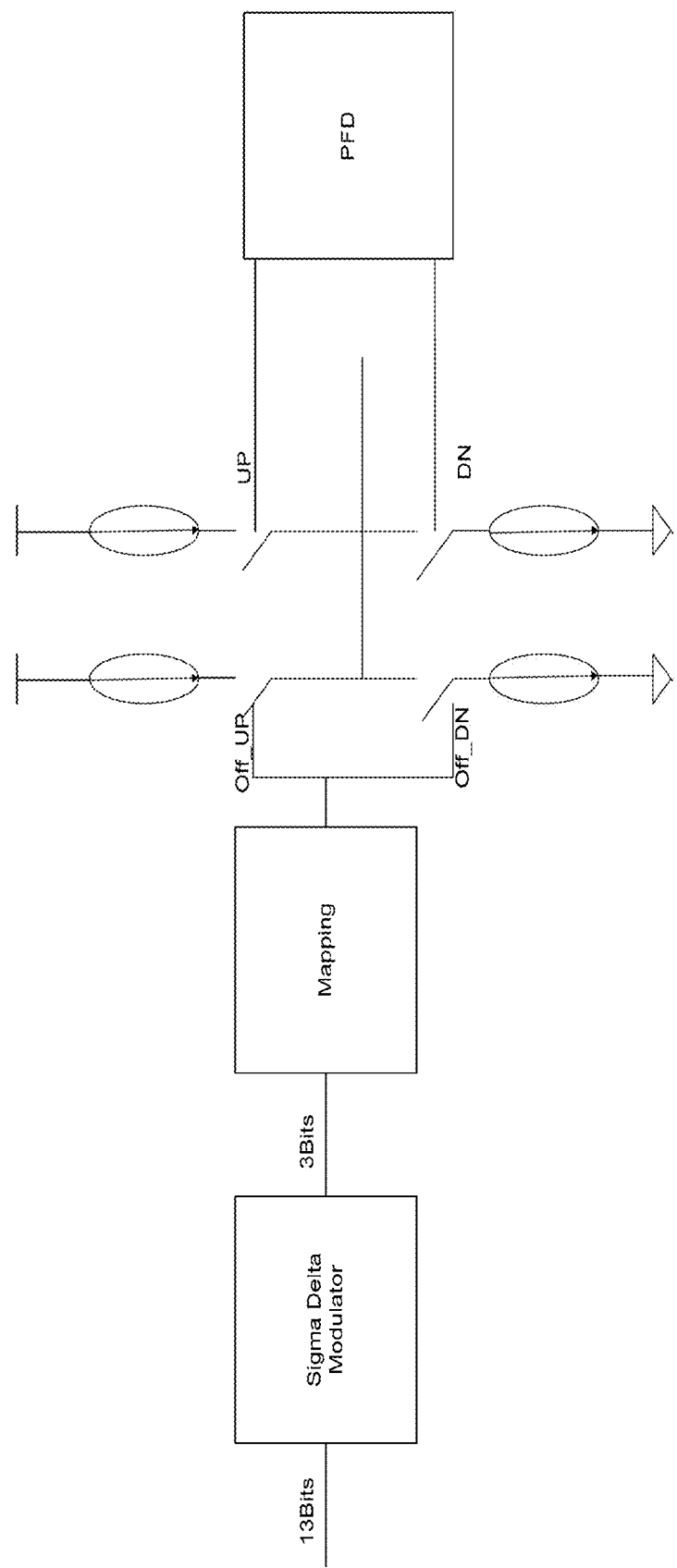
FIG. 10 is a simplified diagram illustrating signal path for skew offset according to an embodiment of the present invention.

FIG. 10 is a simplified diagram illustrating signal path for skew offset according to an embodiment of the present invention. This diagram is merely an example, which should not unduly limit the scope of the claims. One of ordinary skill in the art would recognize many variations, alternatives, and modifications. As can be seen in FIG. 10, the output of the PFD is mapped as a 3-bit data for the SDM, and the SDM generates a 13-bits data that is used to move the output clock of the PLL. More specifically, the offset current from the skew management module is converted to a skew offset code that is used to make adjustment to the PLL clock, which in turns provides skew offset adjustment.

Figure 11:
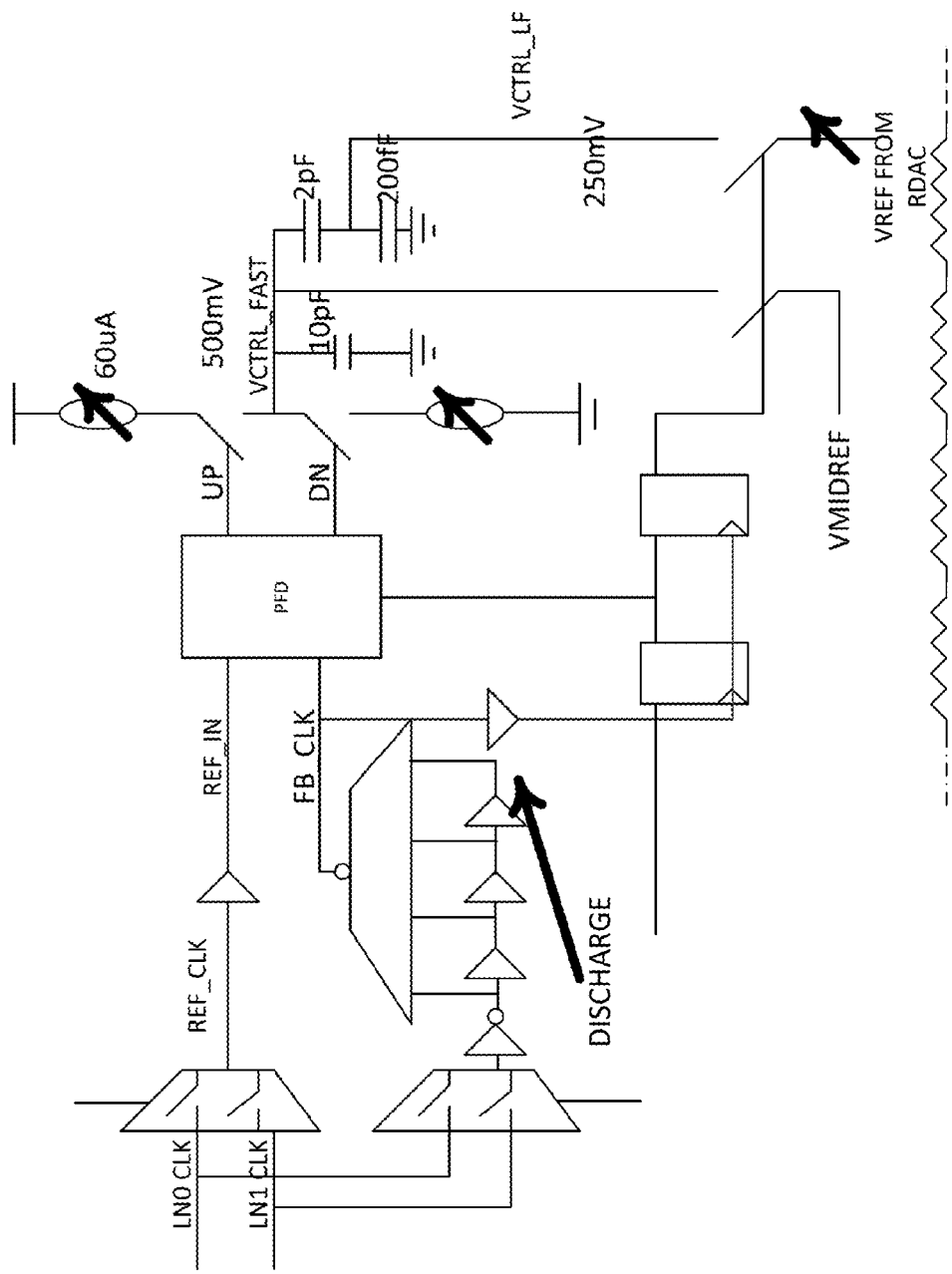
FIG. 11 is a simplified diagram illustrating a skew management module according to an embodiment of the present invention.

FIG. 11 is a simplified diagram illustrating a skew management module according to an embodiment of the present invention. This diagram is merely an example, which should not unduly limit the scope of the claims. One of ordinary skill in the art would recognize many variations, alternatives, and modifications. As shown in FIG. 11, Lane 0 and Lane 1 clocks are respectively used by the PFD as reference and feedback clocks.

Figure 12:
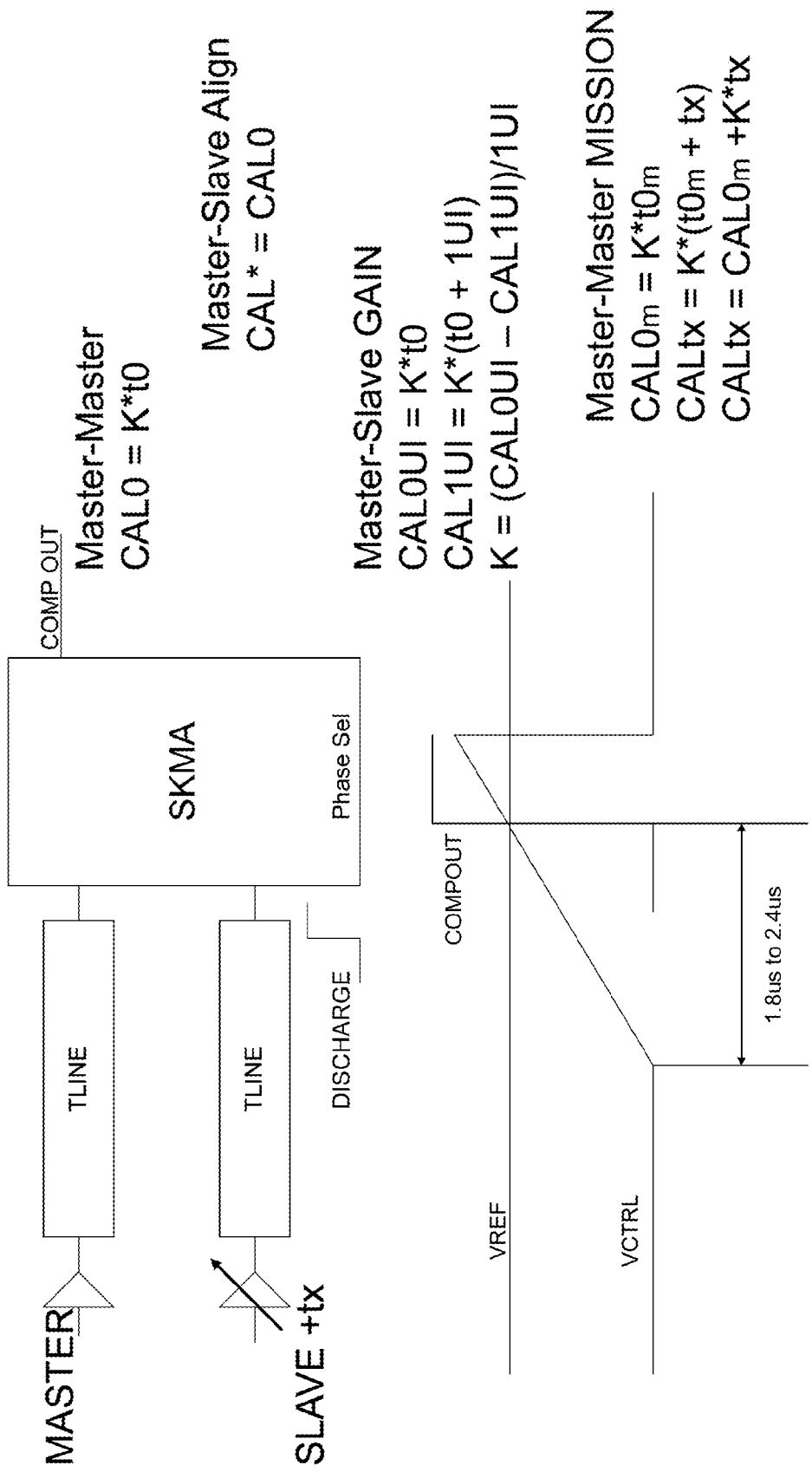
FIG. 12 is a simplified diagram illustrating operation of a skew management module according to an embodiment of the present invention.

FIG. 12 is a simplified diagram illustrating operation of a skew management module according to an embodiment of the present invention. This diagram is merely an example, which should not unduly limit the scope of the claims. One of ordinary skill in the art would recognize many variations, alternatives, and modifications. A slave input (e.g., output from Lane 1) is delay by 1 UI relative to the master input (e.g., output from Lane 0), and the skew management module (SKMA) according ramps up and then discharges the control voltage at the comparator output, thereby providing the offset needed to management the skew between the two lines. The amount of time it takes to charge the control voltage (Vctrl) up to the reference voltage (Vref) level quantifies the amount of skew. The amount of skew is then translated to the amount of delay that needs to be introduced to the communication lane to make proper alignment.

Figure 13:
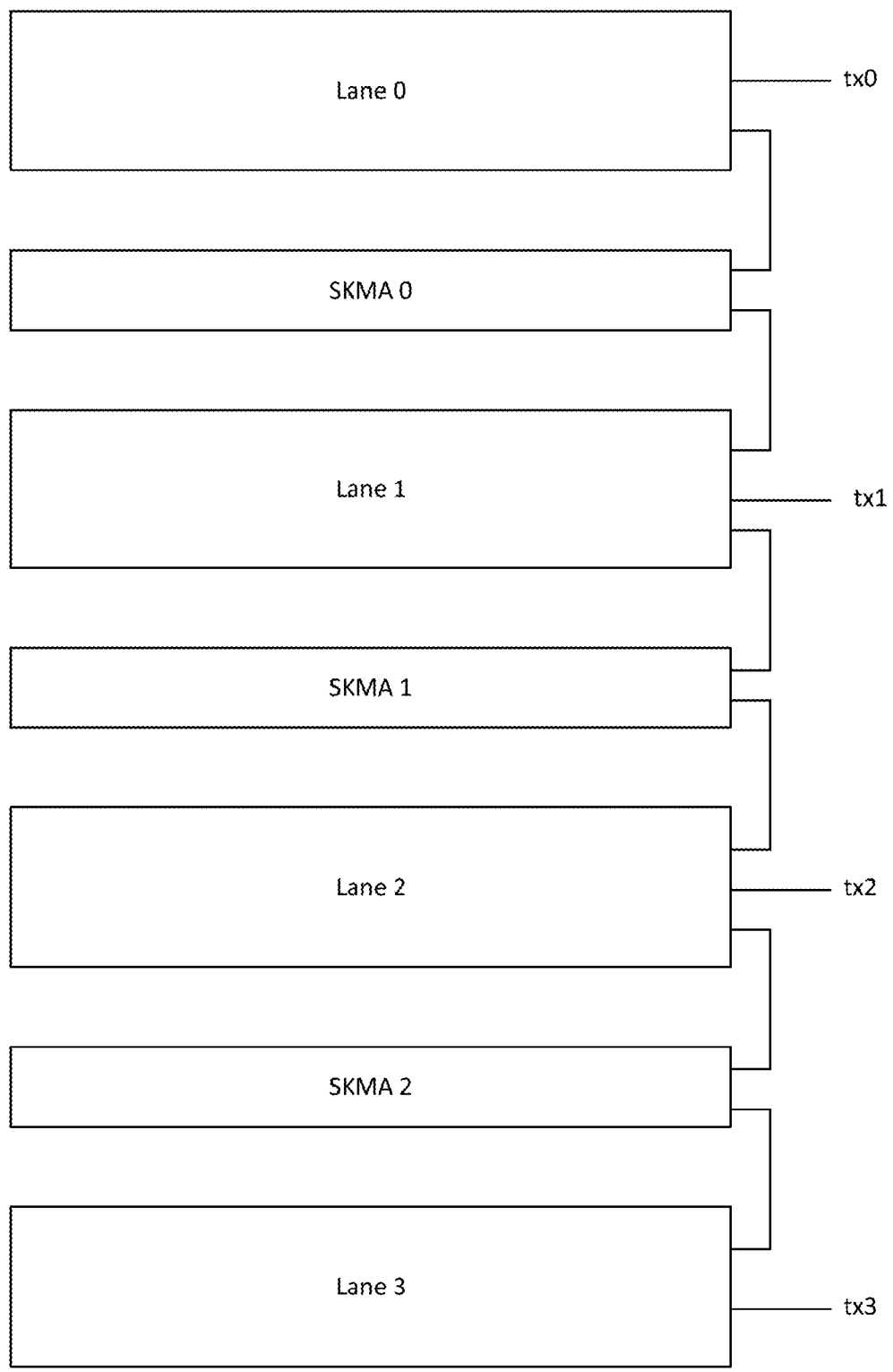
FIG. 13 is a simplified diagram illustrating a PAM(n) communication system according to an embodiment of the present invention.

It is to be appreciated that communication system 800, as explained above, uses a replica data paths at the skew module 820 to provide skew compensation. The SDM 833 of the PLL 932 introduces skew to align data between two communication lanes. It is to be appreciated that skew offset as determined by the communication 800 may be attributed to various factors, such as data path mismatch, Monte Carlo mismatch, and/or others. With the use of skew management modules and techniques described according to the present invention, two or more communication lanes can be aligned in a cascading configuration. FIG. 13 is a simplified diagram illustrating a PAM(n) communication system according to an embodiment of the present invention. This diagram is merely an example, which should not unduly limit the scope of the claims. One of ordinary skill in the art would recognize many variations, alternatives, and modifications. As shown in FIG. 13, two adjacent communication lanes share a skew management module. For example, skew management module SKMA 0 provides alignment between Lane 0 and Lane 1, SKMA 1 provides alignment provides alignment between Lane 1 and Lane 2, and SKMA 2 provides alignment between Lane 2 and Lane 3. For example, by combining output of 3 lanes, PAM8 modulation can be provided. It is to be appreciated that PAM(n) systems can be arranged in a similar fashion to the system illustrated in FIG. 13. During a process of aligning the communication lanes, a predetermined sequence of aligning communication lanes is used. For example, Lane 0 and Lane 1 are aligned first, and then Lane 1 and Lane 2 are aligned, and so on.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A communication system comprising:
a first communication lane comprising a first phase lock loop (PLL) and a first pattern generator, the first communication lane being configured to output a first data segment, the first pattern generator being configured to generate a first predetermined pattern, the first PLL being configured to generate a first clock signal;
a second communication lane comprising a second PLL and a second pattern generator, the second PLL being configured to provide a second clock signal, the second PLL comprising a sigma-delta modulator (SDM), the second communication lane being configured to output a second data segment, the second pattern generator being configured to generate a second predetermined pattern, the SDM being configured to generate a skew offset using an analog offset signal for the second clock signal;
a pulse amplitude modulation (PAM) circuit being configured to align the first data segment and the second data segment and output a PAM signal; and
a skew management circuit being configured to generate the analog offset signal, the skew management circuit comprising a phase frequency detector (PFD) and a charge pump and a comparator, the PFD being configured to generate a control current by comparing the first predetermined pattern and the second predetermined pattern, the charge pump being configured to store the control current and characterized by a control voltage, the comparator being configured to generate the analog offset signal by comparing the control voltage to a predetermined reference voltage.

2. The system of claim 1, further comprising: a third communication lane for outputting a third data segment; and
a combiner circuit for combining the first data segment, the second data segment, and the third data segment.

3. The system of claim 1, wherein the skew management circuit further comprises a reset circuit for discharging the charge pump.

4. The system of claim 1, wherein the skew management circuit further comprises a first MUX and a second MUX, the first MUX and the second MUX being configured to alternatively output the first predetermined pattern and the second predetermined pattern.

5. The system of claim 1, wherein the first data segment corresponds to a least significant bit (LSB) section and the second data segment corresponds to a most significant bit (MSB) section of the PAM signal.

6. The system of claim 1, wherein the first communication lane further comprises a serializer for processing input data.

7. The system of claim 1, wherein the first communication lane further comprises a current circuit logic for outputting the first data segment.

8. The system of claim 1, wherein the first clock signal and the second clock signal are synchronized at a predetermined rate.

9. The system of claim 1, wherein the first communication lane further comprises a divider for processing input data.

10. The system of claim 1, further comprising an electrical combiner for combining the first data segment and the second data segment.

11. The system of claim 1, further comprising an optical combiner for combining the first data segment and the second data segment.

12. The system of claim 1, further comprising a digital-to-analog converter (DAC) for generating the predetermined reference voltage.

13. A communication system comprising:
a first communication lane comprising a first phase lock loop (PLL) and a first pattern generator, the first communication lane being configured to output a first data segment, the first pattern generator being configured to generate a first predetermined pattern, the first PLL being configured to generate a first clock signal;
a second communication lane comprising a second PLL and a second pattern generator, the second PLL being configured to provide a second clock signal, the second PLL comprising a first sigma-delta modulator (SDM), the second communication lane being configured to output a second data segment, the second pattern generator being configured to generate a second predetermined pattern, the first SDM being configured to generate a first skew offset using a first analog offset signal for the second clock signal;
a third communication lane comprising a third PLL and a third pattern generator, the third communication lane being configured to output a third data segment, the third pattern generator being configured to generate a third predetermined pattern, the third PLL comprising a second SDM, the second SDM being configured to generate a second skew offset using a second analog offset signal for a third clock signal;
a pulse amplitude modulation (PAM) circuit being configured to align the first data segment, the second data segment, and the third data segment and output a PAM signal;
a first skew management circuit being configured to generate the first analog offset signal, the first skew management circuit comprising a phase frequency detector (PFD) and a charge pump and a comparator, the PFD being configured to generate a control current by comparing the first predetermined pattern and the second predetermined pattern, the charge pump being configured to store the control current and characterized by a control voltage, the comparator being configured to generate the first analog offset signal by comparing the control voltage to a predetermined reference voltage; and
a second skew management circuit being configured to generate the second analog offset signal based at least on the second predetermined pattern and the third predetermined pattern.

14. The system of claim 13, wherein the system comprises n communication lanes and a PAM(n) circuit for generating a PAMn signals by aligning and combining outputs from the n communication lanes, the n communication lanes including the first, second, and third communication lanes, n being the number of PAM levels.

15. The system of claim 13, further comprising a fourth communication lane and a third skew management circuit.

16. The system of claim 13, wherein the first communication lane is configured to receive a never return to zero (NRZ) signal.

17. A skew management device comprising:
a first input selector circuit being configured to output a reference signal based on a first selected signal of two input signals, each of the two input signals comprising a predetermined pattern;
a second selector circuit being configured to output a feedback signal based on a second selected signal of the two input signals;
a phase frequency detector configured to generate a control current based on the reference signal and the feedback signal;
an integrator circuit being configured to store the control current over a predetermined period of time and characterized by a control voltage;
a comparator circuit being configured to generate an analog offset signal based on the control voltage and a reference voltage; and
a reset circuit for discharging the integrator circuit.

18. The device of claim 17, further comprising a delay line coupled between the second selector circuit and the phase frequency detector.

19. The device of claim 17, further comprising a digital-to-analog converter (DAC) for generating the reference voltage.

* * * * *